(12) United States Patent
Amemiya et al.

(10) Patent No.: US 6,642,528 B2
(45) Date of Patent: Nov. 4, 2003

(54) ALIGNMENT MARK DETECTION METHOD, AND ALIGNMENT METHOD, EXPOSURE METHOD AND DEVICE, AND DEVICE PRODUCTION METHOD, MAKING USE OF THE ALIGNMENT MARK DETECTION METHOD

(75) Inventors: Mitsuaki Amemiya, Utsunomiya (JP); Masami Tsukamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,563

(22) Filed: Nov. 9, 2001

(65) Prior Publication Data

US 2002/0079462 A1 Jun. 27, 2002

Related U.S. Application Data

(63) Continuation of application No. 08/725,400, filed on Oct. 3, 1996, now Pat. No. 6,331,709.

(30) Foreign Application Priority Data

Oct. 6, 1995 (JP) .............................................. 7-260092

(51) Int. Cl.⁷ ................................................ H01J 37/30
(52) U.S. Cl. .................................................. 250/491.1
(58) Field of Search ......................... 250/491.1, 492.2; 378/34, 35, 43, 84; 430/5, 321, 322

(56) References Cited

U.S. PATENT DOCUMENTS

| 4,085,329 A | 4/1978 | McCoy et al. ........... 250/492 A |
| 4,335,313 A | 6/1982 | Kreuzer et al. ............. 250/491 |
| 4,604,345 A | 8/1986 | Amemiya ................... 430/394 |
| 4,857,742 A | 8/1989 | Kato et al. ................ 250/491.1 |
| 4,896,045 A | 1/1990 | Okunuki et al. .......... 250/492.2 |
| 4,935,947 A | 6/1990 | Amemiya .................... 378/119 |
| 5,004,925 A * | 4/1991 | Takahashi et al. ........ 250/491.1 |
| 5,131,022 A | 7/1992 | Terashima et al. ............. 378/34 |
| 5,153,898 A * | 10/1992 | Suzuki et al. .................. 378/34 |
| 5,157,700 A | 10/1992 | Kurosawa et al. ............. 378/34 |
| 5,172,403 A | 12/1992 | Tanaka et al. ................. 378/34 |
| 5,323,440 A | 6/1994 | Hara et al. ..................... 378/34 |
| 5,440,394 A | 8/1995 | Nose et al. .................. 356/384 |
| 5,444,758 A | 8/1995 | Miyake et al. ............... 378/113 |
| 5,549,994 A * | 8/1996 | Watanabe et al. ............... 430/5 |
| 5,581,590 A | 12/1996 | Mori et al. .................... 378/34 |
| 5,604,779 A | 2/1997 | Amemiya et al. ............. 378/34 |
| 5,606,586 A | 2/1997 | Amemiya et al. ............. 378/34 |
| 5,641,593 A | 6/1997 | Watanabe et al. ............... 430/5 |
| 6,038,279 A | 3/2000 | Miyake et al. ................. 378/34 |
| 6,331,709 B1 * | 12/2001 | Amemiya et al. ......... 250/491.1 |

* cited by examiner

*Primary Examiner*—Kiet T. Nguyen
(74) *Attorney, Agent, or Firm*—Fitzpatrick, Cella, Harper & Scinto

(57) ABSTRACT

An apparatus and method for detecting an alignment mark on a substrate using electron beams. The method include the steps of setting an accelerating voltage of the electron beams in accordance with the layer structure of the substrate, irradiating the substrate with the electron beams having the accelerating voltage set in the setting step, and detecting one of radiation and electrons from the substrate after the irradiating step is performed, and determining the position of the alignment mark based on the detecting operation. The apparatus includes a device for setting such an accelerating voltage, a device for irradiating the substrate with the electron beams, and a detector for detecting one of the radiation and the electrons. In one embodiment, fluorescent X-rays are detected, while in another embodiment secondary electrons or backscattered electrons are detected.

14 Claims, 8 Drawing Sheets

ALIGNMENT MARK DETECTION METHOD, AND ALIGNMENT METHOD, EXPOSURE METHOD AND DEVICE, AND DEVICE PRODUCTION METHOD, MAKING USE OF THE ALIGNMENT MARK DETECTION METHOD

This application is a continuation of application Ser. No. 08/725,400, filed on Oct. 3, 1996 now U.S. Pat. No. 6,331,709.

BACKGROUND OF THE INVENTION

1. Field of the Invention

The present invention relates to a method for detecting an alignment mark for performing alignment, suitable for use in an exposure device or the like in producing semiconductor devices or the like.

2. Description of the Related Art

In producing semiconductor devices or the like, the most commonly used type of exposure devices utilize visible light or ultraviolet light in order to transfer a mask or reticle circuit pattern onto a wafer. With more advanced micromachining techniques of forming semiconductor circuit patterns, however, almost no further resolution can be provided, when visible or ultraviolet light is used to expose a pattern of the smallest size. Consequently, exposure using shorter wavelengths such as vacuum ultraviolet light or X-rays, or electron beams is drawing attention.

Putting such methods of exposure into practical use has the disadvantage that alignment of the mask and the wafer must be carried out with far greater precision than conventional alignments. In particular, when vacuum ultraviolet rays, X-rays, electron beams or the like are used, exposure must be carried out in a high vacuum, resulting in more severe conditions for alignment. At present, a method of exposure thought to be effective in detecting the position of an alignment mark is one using electron beams that provides high resolution. In general, however, multiple patterns are formed on the wafer by repeating the wafer forming process a plurality of times, causing the layer structure to change every time a cycle of the wafer forming process is repeated. Thus, an alignment mark, being detected using electron beams, is not necessarily detected under the same conditions, so that failure in the detection of an alignment mark may occur.

SUMMARY OF THE INVENTION

Accordingly, an object of the present invention is to provide a method or device that ensures precise detection of the position of an alignment mark, using electron beams.

Another object of the present invention is to provide an alignment method, an exposure method and device, and a device production method, using the alignment method.

To these ends, according to one aspect of the present invention, there is provided a method for detecting an alignment mark on a substrate, using electron beams, wherein an accelerating voltage of the electron beams is set in accordance with a layer structure of the substrate.

According to another aspect of the present invention, there is provided a method for detecting an alignment mark on a substrate, using electron beams, wherein the alignment mark is detected from fluorescent X-rays produced by illuminating the alignment mark by electron beams.

The present invention can also be carried out in the form of an alignment method, an exposure method, and a device production method, making use of either one of the aforementioned methods for detecting an alignment mark.

According to another aspect, the present invention which achieves these objectives relates to a method for detecting an alignment mark on a substrate using electron beams. The method comprises steps setting an accelerating voltage of the electron beams in accordance with a layer structure of the substrate, irradiating the substrate with the electron beams accelerated to the accelerating voltage set in the setting step, and detecting one of radiation and electron beams from the substrate after the irradiating step is performed and determining the position of the alignment mark based on the detecting.

According to still another aspect, the present invention which achieves these objectives relates to a method of detecting an alignment mark on a substrate using electron beams, comprising the steps of irradiating the substrate with electron beams, detecting fluorescent X-rays that are produced as a result of irradiating the substrate with electron beams in the irradiating step, and detecting the position of the substrate on the basis of the detected fluorescent X-rays.

According to still another aspect, the present invention which achieves these objectives relates to an alignment method for aligning a substrate having an alignment mark, comprising the step of setting an accelerating voltage of electron beams, irradiating the substrate with electron beams accelerated to the accelerating voltage set in the setting step, detecting one of radiation and electrons from the substrate after the irradiating step is performed, determining the position of the alignment mark based on the detecting performed in the detecting step, and aligning the substrate in accordance with the determining performed in the determining step.

According to still another aspect, the present invention which achieves these objectives relates to an exposing method for exposing a substrate to radiation projected through a circuit pattern in the mask to form the circuit pattern on the substrate. The method comprises the steps of setting an accelerating voltage of electron beams, irradiating the substrate with electron beams accelerated to the accelerating voltage set in the setting step, detecting one of radiation and electrons from the substrate after the irradiating step is performed, determining the position of the alignment mark based on the detecting performed in the detecting step, aligning the substrate with the mask in accordance with the determining method performed in the determining step, and projecting radiation through the circuit pattern of the mask to the substrate and forming the circuit pattern of the substrate.

According to still another aspect, the present invention which achieves these objectives relates to a device production method for producing a device, comprising the steps of setting an accelerating voltage of electron beams, irradiating the substrate with electron beams accelerated to the accelerating voltage set in the setting step, detecting one of radiation and electrons from the substrate after the irradiating step is performed, determining the position of an alignment mark on the substrate based on the detecting performed in the detecting step, aligning the substrate with a mask in accordance with the determining performed in the determining step, projecting radiation through a circuit pattern of the mask to the wafer and forming the circuit pattern on the wafer, and forming the substrate into a semiconductor device by repeating the projecting and forming step a plurality of times and repeating the irradiating, detecting, determining, and aligning steps each time the projecting step is performed.

According to still another aspect, the present invention which achieves these objectives relates to an apparatus for detecting an alignment mark on a substrate using electron beams, comprising means for setting an accelerating voltage of the electron beams in accordance with the layer structure of the substrate, means for irradiating the substrate with electron beams accelerated to the accelerating voltage set by the setting means, and means for detecting one of radiation and electrons from the substrate after the substrate is irradiated by the irradiating means and for determining the position of the alignment mark based on the detecting.

According to still another aspect, the present invention relates to an apparatus for detecting an alignment mark on a substrate using electron beams comprising means for irradiating the substrate with electron beams, means for detecting fluorescent X-rays that are produced as a result of irradiating the substrate with electron beams by the irradiating means, and means for detecting the position of the substrate on the basis of the detected fluorescent X-rays by the detecting means.

These and other objectives, features, and advantages of the present invention in addition to those discussed above will become more apparent from the following detailed description of preferred embodiment taken in conjunction with the accompanying drawings.

DESCRIPTION OF THE PREFERRED EMBODIMENTS

Figure 1:
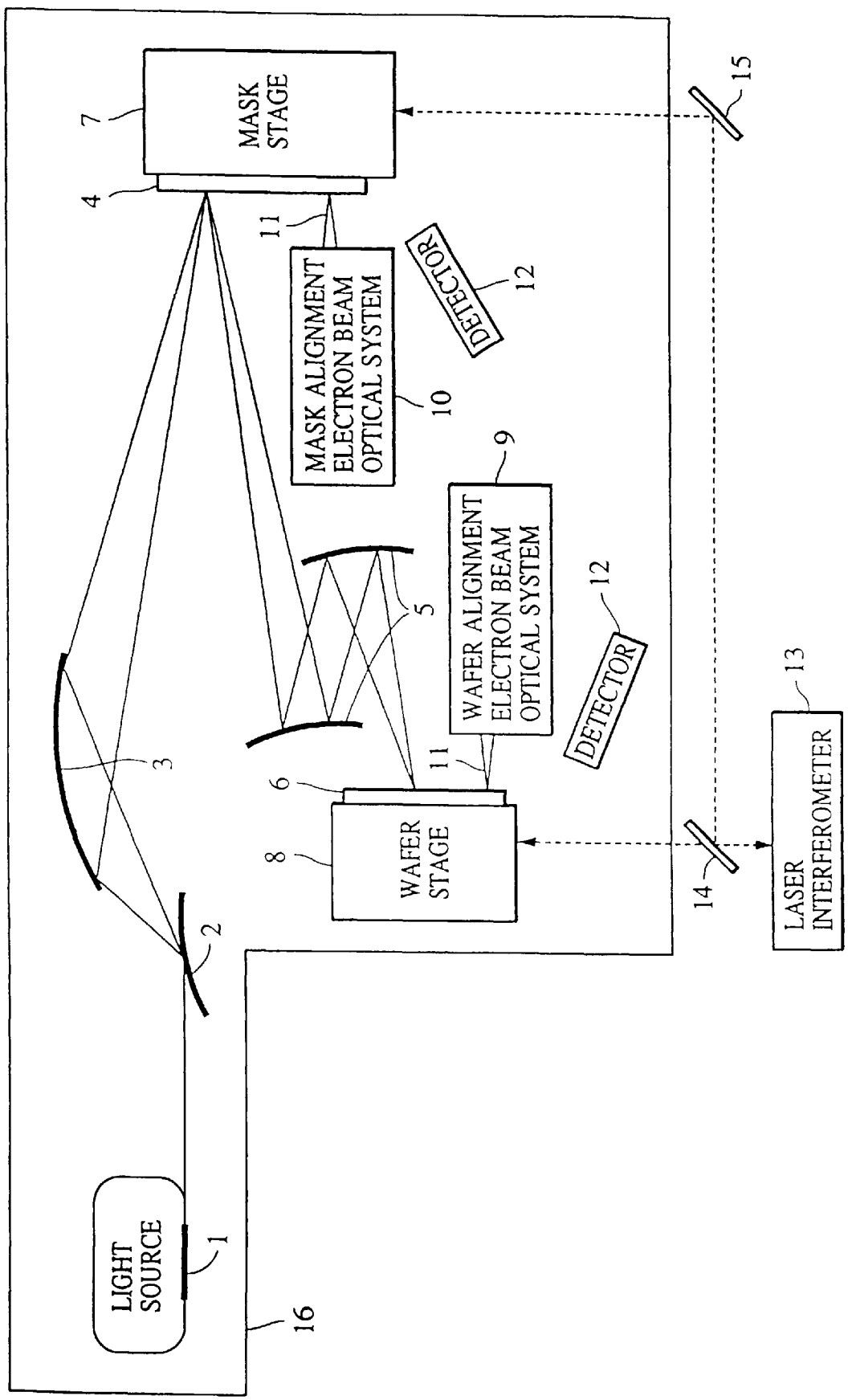
FIG. 1 is an overall schematic view of the construction of an X-ray reduction exposure including an alignment device in an embodiment of the present invention.

A description will now be given of the preferred embodiments of the present invention. In detecting an alignment mark using electron beams, there is a general increase in the amount of fluorescent X-rays produced, or the amount of secondary electrons or backscattered electrons from an edge of the alignment mark, based on the material from which the mark is made, such as aluminum (Al) or gold (Au). (Secondary electrons and backscattered electrons will hereinafter generally be referred to as "secondary/backscattered electrons"). Therefore, it is possible to detect signals from the alignment mark itself. In addition, the electron beams have a large depth of focus, so that they are not easily affected by a resist coated on the wafer. For this reason, this method for detecting an alignment mark has the advantage of allowing direct and precise detection.

The present invention makes it possible to precisely detect an alignment mark covered by a resist or a film formed by evaporation so as to be embedded in a layer structure, by determining a suitable voltage range for accelerating the electron beams in detecting an alignment mark, based on the thickness and the type of material of the foundation layer where the alignment mark to be aligned is formed and the thickness and the type of material of the layer or layers formed on the foundation layer by deposition or the like. A description will now be given of a method for determining the accelerating voltage for electron beams in relation to various combinations of the foundation layer and the upper layer or layers.

(1) Method for Detecting an Alignment Mark from Fluorescent X-rays Produced from the Alignment Mark It is known that in general the element or elements composing an object can be determined from the fluorescent X-rays produced when the object is illuminated by electron beams. The fluorescent X-rays are produced when an orbital electron drops from a higher energy level to a lower energy level. The fluorescent X-rays are called, for example, $K\alpha$ line, $K\beta$ line, or $L\alpha$ line, depending on the energy difference of the energy levels occupied by the electron before and after the X-rays are produced. The X-rays are produced in correspondence with the energy difference, so that the energy of the fluorescent X-rays produced by a particular element corresponds to the energy levels of the particular element. Therefore, it is necessary for the energy of the electron beams to be at least large enough to overcome the binding energy of the orbital electron occupying a lower energy level. This required minimum energy is called an absorption edge.

In the present embodiment, the accelerating voltage is set such that the energy of the electron beam arriving at an alignment mark is higher than the absorption edge of the element(s) of which the mark pattern is made, so that the position of the alignment mark can be determined precisely from the intensity of the fluorescent X-rays being produced. Even if a different layer is formed on the alignment mark, the position of the alignment mark can be determined, regardless of the form of the surface of the upper layer, by detecting the characteristic fluorescent X-rays produced by the material of which the alignment mark is made.

(2) Method for Detecting an Alignment Mark from Secondary/backscattered Electrons Produced from the Alignment Mark In detecting the position of an alignment mark from the intensity of the secondary/backscattered electrons or the backscattered electrons from an edge of the alignment mark illuminated by electron beams, the accelerating voltage of the electron beams is set such that the number of secondary/backscattered electrons from the pattern is close to the maximum amount of secondary/backscattered electrons produced from irradiation of an edge of the alignment mark with electron beams. Since the number of secondary/backscattered electrons emitted from an object depends on the energy of the incident electrons and the element of which the object is made, a large signal output can be obtained by setting the accelerating voltage of the electron beams to a suitable value based on the material making up the alignment mark. If a film made of a material different from that making up the alignment mark is formed on the surface of the alignment mark by evaporation, the accelerating voltage of the electron beams should be set such that the number of secondary/backscattered electrons from the alignment mark is close to the maximum amount, taking into account the amount of energy that the electron beams lose as they pass through the upper layer.

A description will now be given of several specific examples in accordance with the present invention. Although in the following description an X-ray reduction exposure device is taken as an example, the alignment device may also be used in a real-size X-ray device, a vacuum ultraviolet ray exposure device, an electron beam exposure device, or the like.

X-Ray Reduction Exposure

FIG. 1 is an overall view of the construction of an X-ray reduction exposure device including an alignment device. In the exposure device, X-rays, emitted from an undulator light source 1, pass through an illuminating light system and illuminate a reflection-type mask 4. The illuminating system is composed of a total reflection mirror 2 with a convex surface and a multi-layered reflection mirror 3 with a concave surface. The reflection-type mask 4 has a pattern composed of a non-reflection portion and a reflection portion formed from multi-layer reflectors. The X-rays, reflected by the reflection-type mask 4, is focused onto a wafer 6 through a reduction projection optical system 5 comprising two mirrors. The reflection-type mask 4 is mounted to a mask stage 7, while the wafer 6 is mounted to a wafer stage 8.

An alignment device is provided because the pattern on the reflection-type mask 4 must be transferred onto a predetermined portion of the wafer 6. An alignment mark of the mask 4 and that of the wafer 6 are aligned by illuminating the alignment mark of the wafer 6 and that of the mask 4 with a wafer alignment electron beam optical system 9 and a mask alignment electron beam optical system 10, respectively. Here, the X-ray detectors 12 are electron detectors or fluorescent X-ray detectors, which detect secondary/backscattered electrons emitted from the alignment mark.

Each of the above-described component parts is placed in a high vacuum chamber in order to prevent a considerable decrease in the amount of X-rays or electron beams due to the atmosphere.

Only a portion of the reflection-type mask 4 is illuminated by the illuminating optical system because the beams impinge upon an area of the mask 4 as if they have passed through a slit. Accordingly, the mask stage 7 having mounted thereto the reflection-type mask 4 and the wafer stage 8 having mounted thereto the wafer 6 are both moved in order to allow scanning and exposure of the wafer. A measurement system composed of a laser interferometer 13, a half mirror 14, and a mirror 15, is provided to monitor the movement of the stages.

Detection of Fluorescent X-Rays

Figure 2:
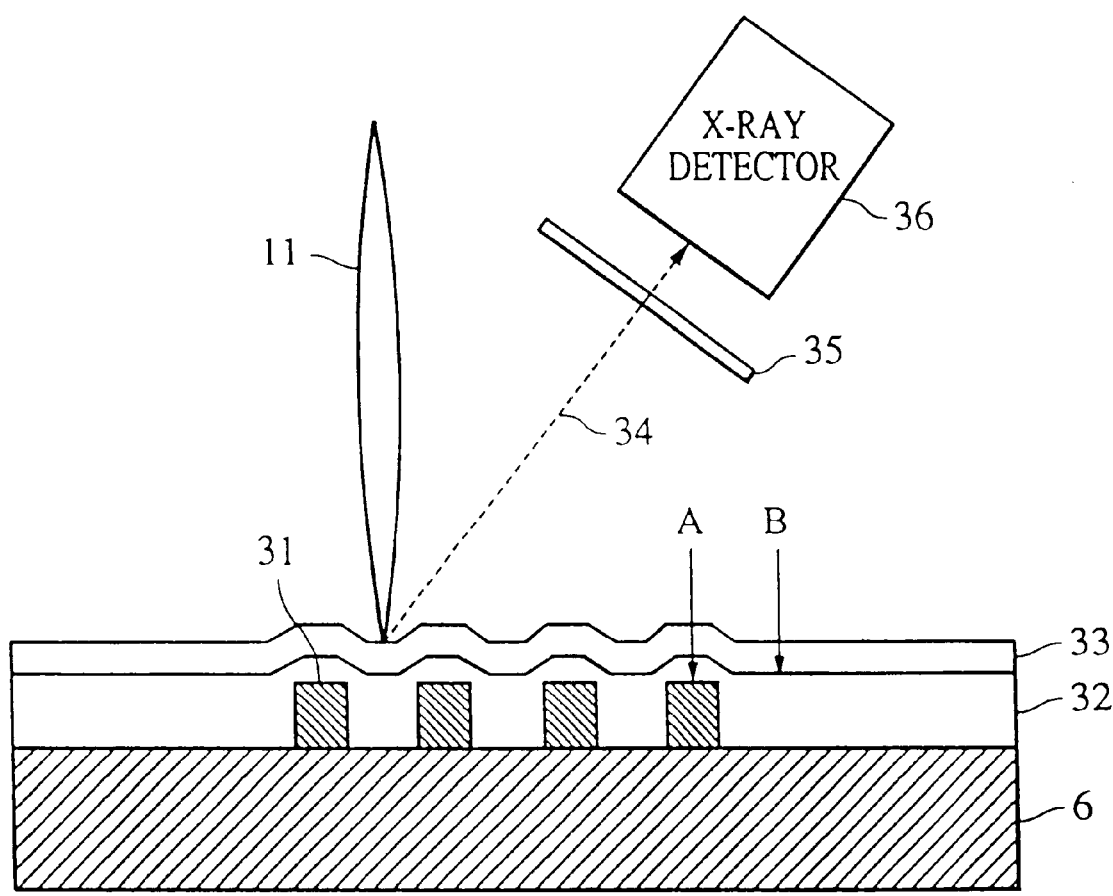
FIG. 2 is a schematic view showing the method for detecting the position of an alignment mark by detecting fluorescent X-rays.

FIG. 2 illustrates an alignment device detecting an alignment mark by illuminating the wafer with electron beams. An alignment mark 31 is formed on the wafer 6 which has already been pre-processed. The wafer is made of, for example, silicon (Si), whereas the alignment mark is made of, for example, aluminum (Al). An $SiO_2$ layer 32 covers the alignment mark 31 and the wafer 6, and the $SiO_2$ layer 32 is covered with a resist layer 33.

When converging electron beams illuminate the surface of the wafer, secondary/backscattered electrons or fluorescent X-rays are generated, in accordance with the form of the object to be illuminated and the element(s) of which the object is made. Detection by X-ray detector 36 of the secondary/backscattered electrons or fluorescent X-rays 34 produced by electron beams 11 that scan the wafer 6 in the direction of the arrow of FIG. 2 allows the intensity of the detection signals to be obtained as a function of the location at which the electron beams strike the wafer 6 (or as a function of the time). The X-ray detector 36 of FIG. 2 corresponds to the X-ray detector 12 of FIG. 1.

In the embodiment, the accelerating voltage of the electron beams 11 is 10 KeV.

In considering the type of fluorescent X-rays produced, the following table gives the fluorescent X-rays (Kα line) produced by Si, Al, and oxygen (O) that are the main elements forming the wafer 6 and the alignment mark 31, the upper layer 32, and the resist layer 33, and the energy of the absorption edge of each of these elements:

| Element | Kα line (K absorption edge) | Transmittance of Al (3 μm thick) |
| --- | --- | --- |
| Si | 1.739 KeV (1.838 KeV) | 7.6% |
| Al | 1.486 KeV (1.559 KeV) | 76.6% |
| O | 0.525 KeV (0.531 KeV) | 0.4% |

From the above table it is evident that the fluorescent X-rays that are produced are only those that have an absorption edge of less than the accelerating voltage of 10 KeV of the electron beams, so that only the Kα line of Si, Al, and O are produced. However, since a filter 35, made of Al and being 3 μm thick, is provided in front of the X-ray detector 36, the Kα line other than those of Al are cut, so that the detector 36 essentially detects the Kα line of Al. More specifically, the detection output of fluorescent X-rays produced by Al increases, only when the electron beams pass along the surface of the alignment mark of Al (denoted by reference character A in FIG. 2), so that the position of the alignment mark can be determined by detecting the location where the detection output increases. When the electron beam passes the portion of the upper layer 32 spaced from the alignment mark (denoted by reference character B) the output of detector 36 does not increase.

In the embodiment, the X-ray detector 36 has been described as one, such as a photodiode, capable of measuring only the intensity of the fluorescent X-rays. When an X-ray detector, such as a solid state detector (SSD), capable of detecting both the intensity and the energy of X-rays, is used, however, it becomes unnecessary to use the filter 35.

Figure 3:
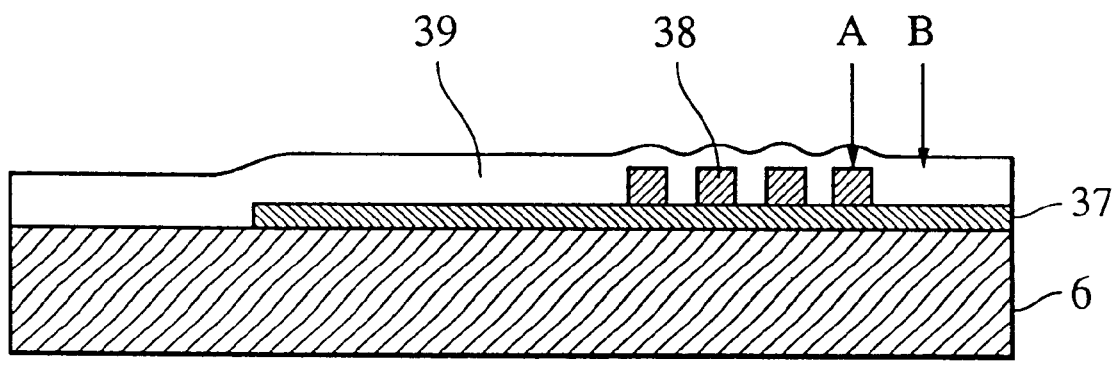
FIG. 3 is a schematic cross-sectional view of an example of another layer structure, different from the layer structure of FIG. 2.

A description will now be given of the setting of the accelerating voltage of electron beams for a different layer structure, in which an $SiO_2$ alignment mark is formed on a Cu layer, as illustrated in FIG. 3. Referring to FIG. 3, a Cu layer 37 is formed on the wafer 6, with an alignment mark 38 made of $SiO_2$ formed on the Cu layer 37. In addition, a resist layer 39 is formed so as to cover the aforementioned layers. The fluorescent X-rays (Kα line, Lα line) of Cu, Si, and O, and the energy of the absorption edge of these elements are given in the table below.

| Element | Kα line (K absorption edge) | Lα line (L absorption edge) |
| --- | --- | --- |
| Cu | 8.040 KeV (8.980 KeV) | 0.930 KeV (1.1 KeV) |
| Si | 1.739 KeV (1.838 KeV) | |
| O | 0.525 KeV (0.531 KeV) | |

Here, the accelerating voltage of the electron beams is set higher than the K absorption edge of Si, but smaller than the absorption edge of Cu. (The accelerating voltage is set at 5

KeV in the present embodiment.) When the accelerating voltage is set at this value, the Kα line and the Kβ line of Cu are not produced, so that the Kα line of Si and the Lα line of Cu are detected. Actually, however, the Lα line of Cu is produced less efficiently than the Kα line of Si, and possesses low energy which decreases abruptly due to a blocking layer of the detector, so that the fluorescent X-rays that are detected are essentially only those from the $SiO_2$ alignment mark, i.e. those detected when the electron beams pass along the surface of the alignment marks 38 (denoted by reference character A) rather than when the beams pass over an area spaced from alignment marks 38 (denoted by reference character B), even when a filter is not used, resulting in determination of the position of the alignment mark.

Detection of Secondary/Backscattered Electrons

A description will now be given of another way of determining the position of an alignment mark by an alignment device by detecting secondary/backscattered electrons ejected from the alignment mark illuminated by electron beams.

Figure 4:
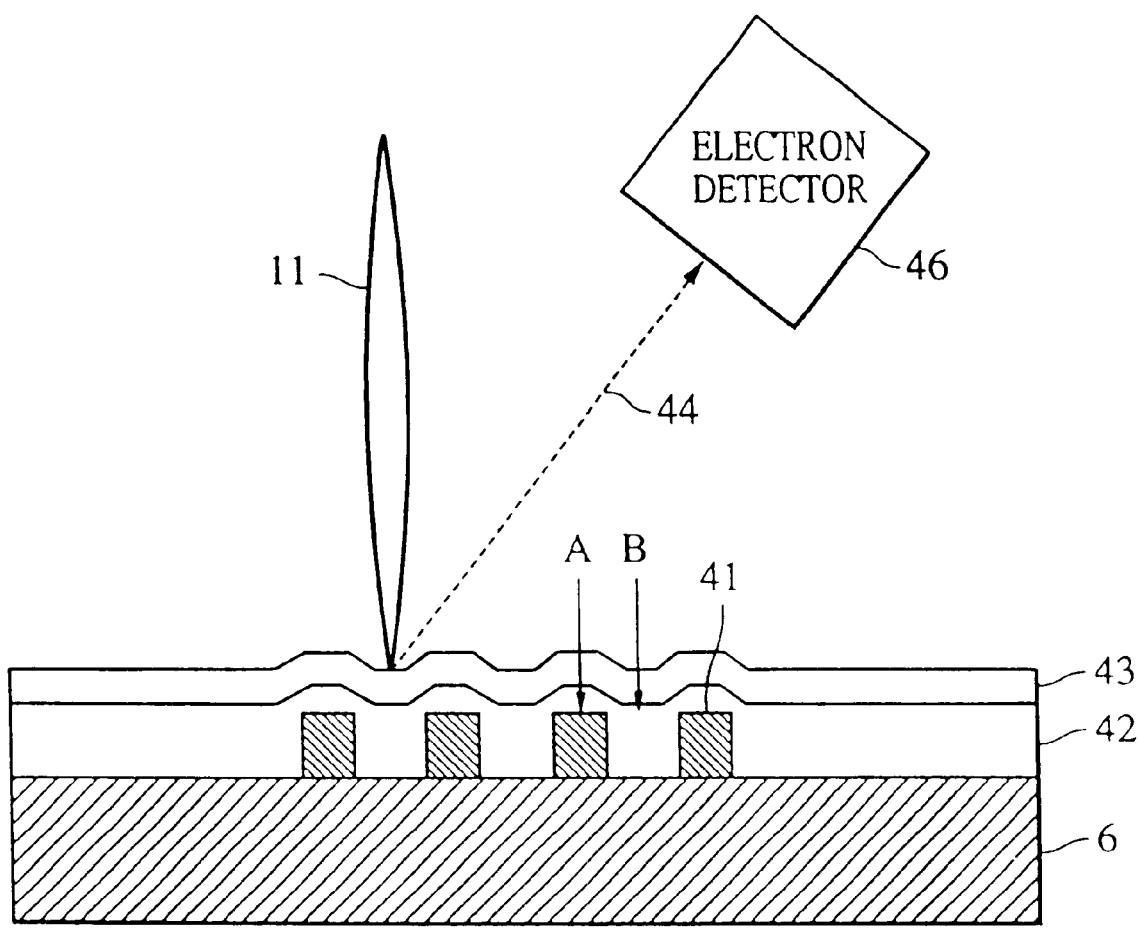
FIG. 4 is a schematic cross-sectional view showing the method for detecting the position of an alignment mark by detecting secondary/backscattered electrons.

Referring to FIG. 4, an alignment mark 41, made of Au and being 0.3 μm thick, is formed on the wafer 6, which is made of Si. An $SiO_2$ layer 42, being an upper layer and 0.3 μm thick, is formed on the alignment mark 41. A resist layer 43, being 0.2 μm thick, is formed on the $SiO_2$ layer 42. An electron detector 46 detects secondary/backscattered electrons emitted from the alignment mark 41 illuminated by the electron beams 11. The electron detector is preferably a Faraday cup for measuring current, or a diode-type detector for measuring total energy.

In this method, during illumination by electron beams, the electrons pass through the $SiO_2$ layer, and lose energy as they change orbits due to repeated elastic and inelastic scattering of the electrons by Au or Si. However, some of the electrons, scattered elastically a few number of times, move to much higher orbits and escape from the surface of the resist, and are detected by the electron detector 46. The scattering angle and the scattering cross section of elastic scattering depends on the element of which the target is made and the energy of the electrons, so that the amount of secondary/backscattering electrons detected varies with the material through which the electrons move. The layer structure of the portion including an alignment mark (indicated by reference character A) comprises a resist layer (0.2 μm thick), an $SiO_2$ layer (0.1 μm thick), an Au layer (0.3 μm thick), and an Si layer. On the other hand, the layer structure of the portion where an alignment mark is not present (indicated by reference character B) comprises a resist layer (0.2 μm thick), an $SiO_2$ layer (0.1 μm thick), and an Si layer. When electron beams irradiate a wafer with the aforementioned layer structure portions, a larger number of secondary/backscattered electrons is ejected from the portion (indicated by reference character A) where an alignment mark is present, since it is more likely that secondary/backscattered electrons are ejected from Au than from Si.

Figure 5:
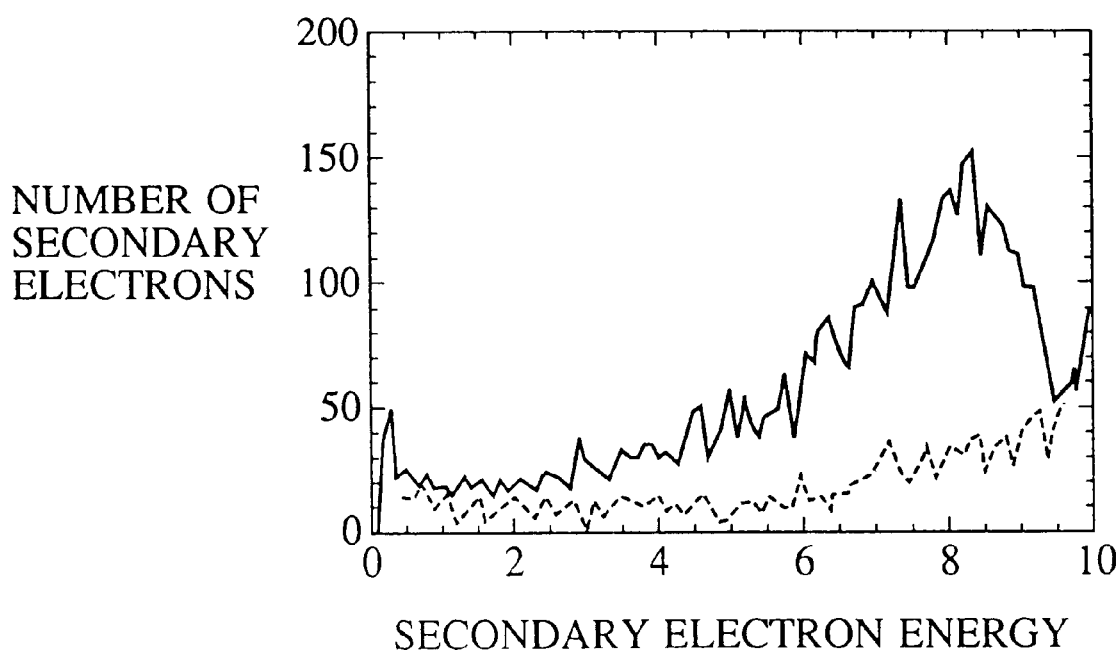
FIG. 5 is a graph indicating the number of emitted secondary/backscattered electrons emitted.

The graph of FIG. 5 is obtained by computing the number of secondary/backscattered electrons emitted when electrons are made incident upon an object, with the accelerating voltage of the electron beams set at 10 KeV. The horizontal axis indicates the energy of the secondary/backscattered electrons, while the vertical axis indicates the number of secondary/backscattered electrons. In the graph, the solid line indicates the number of secondary/backscattered electrons emitted from the portion A where an alignment mark is present, while the broken line denotes the number of secondary/backscattered electrons emitted from the portion B where an alignment mark is not present. It can be seen that the number of secondary/backscattered electrons emitted from the portion where an alignment mark is present is greater than that emitted from the portion where an alignment mark is not present. Therefore, when the portion near an alignment mark is scanned with electron beams, a larger signal output is produced from the alignment mark, so that the position of the alignment mark can be determined.

Figure 6:
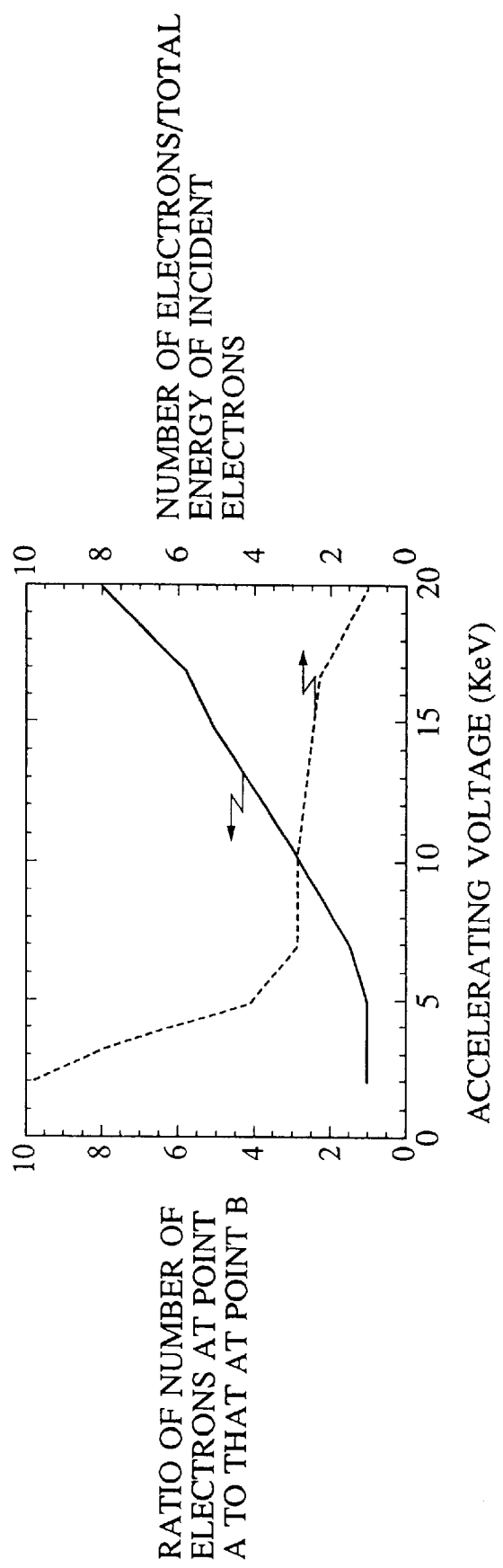
FIG. 6 is a graph showing a ratio of the signal intensity at a point where an alignment mark is present to that at a point where an alignment mark is not present.

Here, the greater the ratio of the intensity of the signal output of the portion A where an alignment mark is present to that of the portion B where an alignment mark is not present, the more precisely the position of the alignment mark can be determined. This ratio depends on the accelerating voltage of the electrons. FIG. 6 is a graph in which the solid line indicates the ratio of the intensity of the signal output (or the total number of electrons) produced at point A where an alignment mark is present to that produced at point B where an alignment mark is not present, when electrons with different accelerating voltages irradiate an object. When the accelerating voltage of the electrons is less than 5 KeV, the signal strength ratio is about 1, making it difficult to determine the position of the alignment mark, but as the accelerating voltage of the electrons is increased, the ratio of the amounts of secondary/backscattered electrons emitted becomes greater, making it easier to determine the position of the alignment mark.

On the other hand, although as the accelerating energy increases the ratio of the amounts of the secondary/backscattered electrons increases, the amount of secondary/backscattered electrons decreases because the incident electrons move deeply into the object and forward scattering becomes larger. Therefore, the accelerating voltage of the electrons cannot be made very large in order to obtain a highly intense signal output. In the graph of FIG. 6, the broken line indicates the ratio of the number of secondary/backscattered electrons to the total energy of the incident electrons. It shows that when the accelerating voltages exceeds 15 KeV, the amount of secondary/backscattered electrons starts decreasing.

From the above, it can be seen that it is preferable to set the accelerating voltage of the electron beams such that the solid line of FIG. 6 indicates a high ratio between the number of secondary/backscattered electrons emitted from the portion where an alignment mark is present and the number emitted from the portion where an alignment mark is not present, and that the broken line of FIG. 6 indicates the production of a large number of secondary/backscattered electrons over a wide range. In other words, it is preferable to set the accelerating voltage of the electron beams within a range of from 10 KeV to 15 KeV in order to determine the position of an alignment mark with high precision.

In the foregoing description, an optimum accelerating voltage for the electron beams has been given with reference to two methods of determining the position of an alignment mark, one determining the position by detecting fluorescent X-rays and the other determining the position by detecting secondary/backscattered electrons. However, the optimum range of the accelerating voltage varies with the material and thickness of the layer structure formed on the wafer, as a cycle of the pre-processing is repeated. Several different methods are given below for setting an optimum accelerating voltage range for the electron beams in accordance with different layer structures.

(1) Determination of Optimum Accelerating Voltage Range By Computation

In general, the layer structure is known before hand, since the layer structure depends on the pre-processing performed. Therefore, as mentioned above, the optimum accelerating voltage range is computed so that the maximum value is obtained for the ratio between the intensity of the signal output of the portion where an alignment mark is present and the intensity of the signal output of the portion where an alignment mark is not present.

(2) Determination of Optimum Accelerating Voltage Range from the Correlation between Form of Alignment Mark and Signal Output Intensity The optimum accelerating voltage is obtained so that the correlation between the form of the alignment mark and the signal intensity is a maximum. More specifically, the form of the alignment mark disposed below the $SiO_2$ layer is predicted from the mask pattern in order to determine the accelerating voltage such that the correlation between the form of the alignment mark and the secondary/backscattered electron signal intensity is a maximum. A specific example is given below of determining the optimum accelerating voltage range based on the correlation between the form of the alignment mark and the signal intensity.

That is, the correlation between the form of the alignment mark and the signal intensity is determined using the following formula:

$$Err(V, x_1) = \int (I(V, x) - H(x-x_1))^2 dx$$

where $H(x)$ represents the form of the alignment mark, and $I(V,x)$ represents the intensity of the secondary electron signals. The value of $x_1$ that satisfies the condition $dErr(V, x_1)/dx_1 = 0$ is defined as $x_1(V)$. While changing the accelerating voltage V, the $Err(V,X_1)$ value with respect to each of the voltage values is obtained, and the minimum $Err(V,X_1)$ value of the obtained $Err(V,X_1)$ values is set as the optimum accelerating voltage. It is to be noted that the correlation can be obtained using formulas other than the aforementioned formula.

(3) Determination of Optimum Accelerating voltage Range from the Correlation between the Intensity of Fluorescent X-rays and that of Secondary/Backscattered Electrons The optimum accelerating voltage for electron beams is obtained such that the correlation between the intensities of the fluorescent X-rays and the secondary/backscattered electrons is a maximum. Fluorescent X-rays are excellent for determining the type of material, and allow the position of the alignment mark to be detected with high precision, but are produced only in small amounts so that the position of the alignment mark cannot be detected in a short time. On the other hand, secondary/backscattered electrons that are detected have a high intensity, but do not allow the position of an alignment mark to be determined easily, because secondary/backscattered electrons are ejected from a material or materials other than the material of which the alignment mark is made. Accordingly, combining the advantages of both the fluorescent X-rays and the secondary/backscattered electrons, by setting the accelerating voltage of electron beams such that the correlation between the strength of the fluorescent X-ray signals and the secondary/backscattered electron signals is a maximum, allow the position of the alignment mark to be detected with high precision and in a short period of time, even without measuring the intensity of fluorescent X-rays after the accelerating voltage has been set. The details of determining the position of an alignment mark is similar to that described in (2).

In the present embodiment, it is preferable to control the amount of electron beams (or electrical current) in the following way. In detecting an alignment mark using electron beams, low-current electron beams are used to roughly determine the position of the alignment mark. Then, high-current electron beams are used such that the intensity of the signal output is large in order to determine the precise location of the alignment mark. Precise detection of the position of the alignment mark is possible without affecting the resist portion other than the resist portion covering the alignment mark, even when the electron beams irradiate an exposure portion, that is a circuit pattern, due to an erroneous movement of a stage or the like, since the current of the electron beams is small.

Depending on the pre-processing, one may want to keep an alignment mark for the next step. In such a case, the amount of exposure is such as to allow the resist to remain after exposure and development. However, changing the structure of the reflection-type mask in accordance with the resist is often wasteful. Accordingly, electron beams are made to scan an alignment mark during alignment in order to provide the required amount of exposure. In other words, the current of electron beams is controlled such that the amount of exposure is sufficient for a negative resist, and the amount of exposure is small for a positive resist.

Device Production Method

A description will now be given of an embodiment of a device production method utilizing the exposure device described above.

Figure 7:
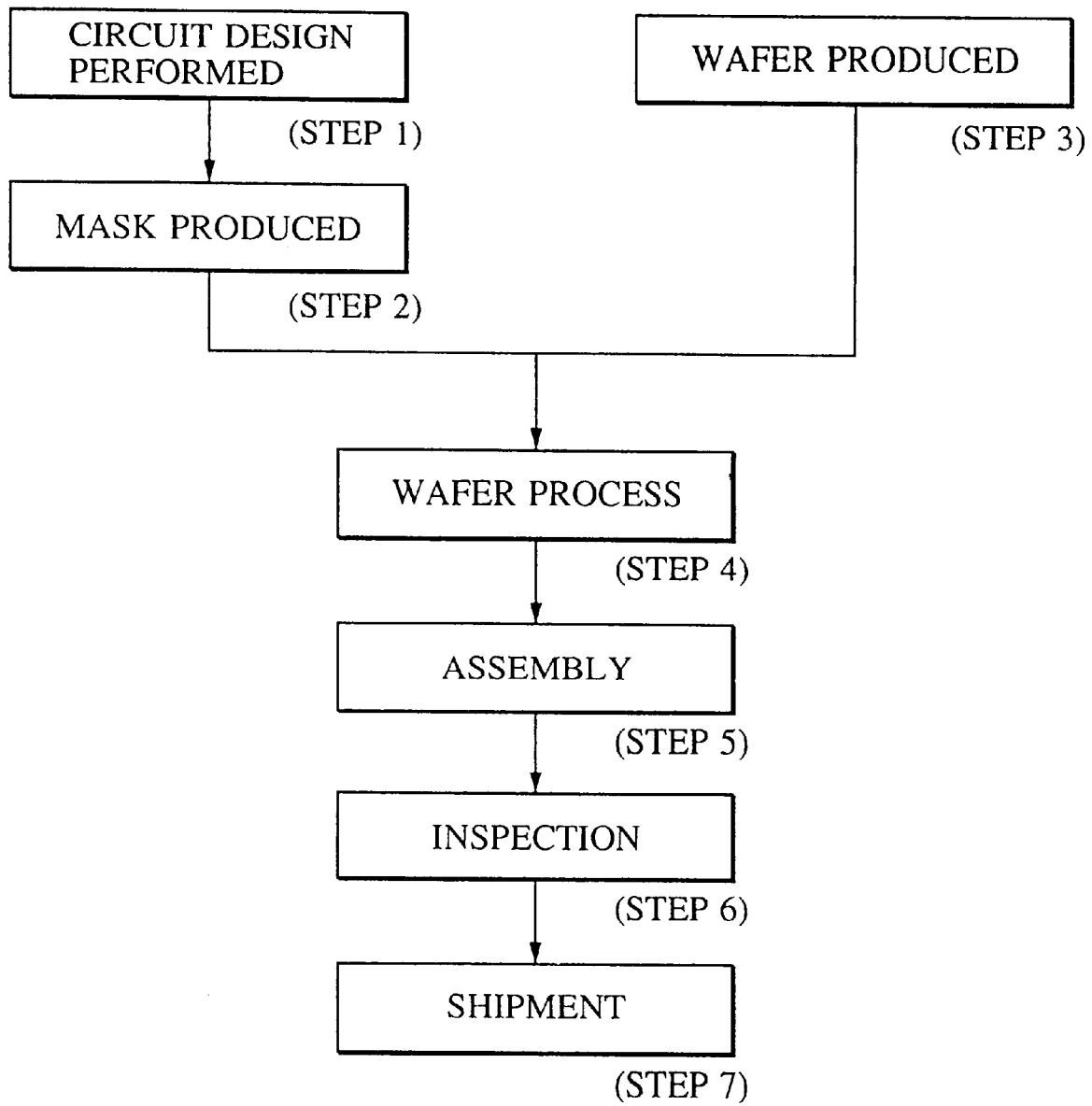
FIG. 7 is a flowchart showing semiconductor device production steps.

FIG. 7 is a flow chart showing production method steps of a tiny device such as a semiconductor chip including an integrated circuit (IC) and a large scale integrated circuit (LSI), a liquid crystal panel, a charge-coupled device (CCD), a thin-film magnetic head, a micromachine, or the like. In Step 1, a circuit pattern is designed for the semiconductor device. Then, in Step 2, a mask with the designed pattern is produced. In Step 3, a wafer is produced, using silicon, glass, or other materials. In Step 4 (wafer process or pre-processing step), the prepared mask with the designed pattern and the wafer are used in order to actually form the circuit onto the wafer using lithography techniques. Then, in the following Step 5 (post-processing step), the wafer with the circuit formed thereon is formed into a semiconductor chip, wherein assembly (dicing, bonding), packaging (of the chip), and the like are performed. In Step 6, the semiconductor device prepared in Step 5 is inspected by conducting operation confirmation and durability tests. Thereafter, in Step 7, the semiconductor device is shipped.

Figure 8:
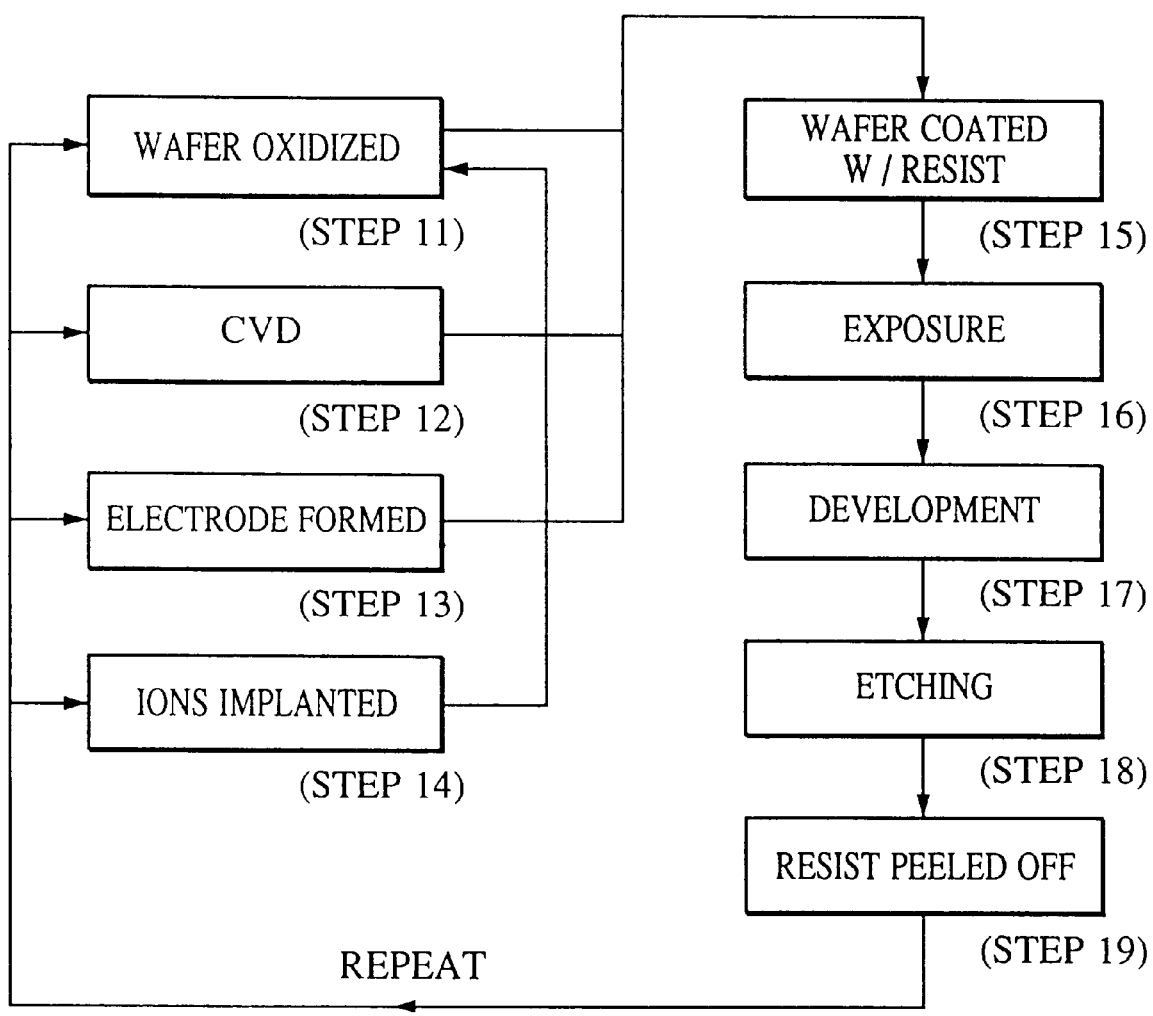
FIG. 8 is a detailed flowchart showing a process for manufacturing semiconductor wafers.

FIG. 8 is a flow chart showing the above-described wafer process in more detail. In Step 11, the surface of the wafer is oxidized. Then, in Step 12 (chemical-vapor deposition (CVD) step), an insulation film is formed on the wafer surface. In Step 13, an electrode is formed on the wafer by evaporation. In Step 14, ions are implanted into the wafer. In Step 15, a photosensitization agent is coated onto the wafer. In Step 16, the mask circuit pattern is printed onto the wafer by exposure using an exposure device including the aforementioned alignment device. In Step 17, the exposed portion of the wafer is developed. In Step 18, portions other than the developed resist image are etched. In Step 19, unwanted resist is removed from the wafer after etching. Multiple circuit patterns are formed on the wafer by repeating the above-described steps. In the present embodiment, an optimum accelerating voltage is set for the electron beams used for making alignments, as described above, so that precise alignments can be performed for each cycle of the above-described processing, even when a cycle of the above-described processing is repeated.

According to the production method in the present embodiment, it is possible to produce highly-integrated semiconductor devices at a lower cost, which has been conventionally difficult to achieve.

What is claimed is:

1. An exposure apparatus comprising:
   an illumination optical system for illuminating a reflection mask by light from a light source;
   a projection optical system having an even number of mirrors for projecting the pattern of the reflection mask onto a wafer;
   first alignment optical system for detecting an alignment mark of the reflection mask; and
   a second alignment optical system for detecting an alignment mark of the wafer, wherein the conditions of detecting the alignment mark of the wafer are changeable.

2. An exposure apparatus claim 1, wherein said second alignment optical system changes the conditions of the detection in accordance with changes of a layer structure of the wafer.

3. An exposure apparatus of claim 1, wherein said second alignment optical system detects the alignment mark of the wafer using an electron beam.

4. An exposure apparatus of claim 3, wherein the conditions for the detection include an accelerating voltage of the electron beam.

5. An exposure apparatus of claim 1, wherein the light are X-rays or ultraviolet rays.

6. A device manufacturing method comprising the steps of:
   illuminating, using an illumination optical system, a reflection mask by light from a light source;
   projecting, using a projection optical system having an even number of mirrors, a pattern of the reflection mask onto a wafer in order to expose the wafer to the pattern;
   detecting an alignment mark of the reflection mask using a first alignment optical system;
   detecting an alignment mark of the wafer, using a second alignment optical system, wherein the conditions of detecting the alignment mark of the wafer are changeable; and
   developing the exposed wafer.

7. A method of claim 6, further comprising changing the condition of the detection, with the second alignment optical system, in accordance with changes of a layer structure of the wafer.

8. A method of claim 6, further comprising detecting, with the second alignment optical system, the alignment mark of the wafer using an electron beam.

9. A method of claim 8, wherein the conditions for the detection include an accelerating voltage of the electron beam.

10. A method of claim 6, wherein the light are X-rays or vacuum ultraviolet rays.

11. An exposure apparatus comprising:
    an illumination optical system for illuminating a reflection mask by X-rays from an X-ray source;
    A projection optical system for projecting a pattern of the reflection mask onto a wafer;
    a first alignment optical system for detecting an alignment mark of the reflection mask;
    a second alignment optical system for detecting an alignment mask of the wafer, and the conditions of detecting the alignment mark of the wafer are changeable;
    a mask stage for mounting the reflection mask; and
    a wafer stage for mounting the wafer,
    wherein the wafer is exposed to the pattern while scanning the reflection mask and the wafer.

12. A device manufacturing method comprising the steps of:
    exposing a wafer to a pattern of a reflection mask using an exposure apparatus according to claim 11; and
    developing the exposed wafer.

13. An exposure apparatus comprising:
    an illumination optical system for illuminating a reflection mask by X-rays from an X-ray source;
    a projection optical system for projecting a pattern of the reflection mask onto a wafer;
    a first alignment optical system for detecting an alignment mark of the reflection mask;
    a second alignment optical system for detecting an alignment mark of the wafer, and the conditions of detecting the alignment mark of the wafer are changeable;
    a mask stage for mounting the reflection mask;
    a wafer stage for mounting the wafer,
    wherein the mounting surface of the mask stage and the mounting surface of the wafer stage face each other.

14. A device manufacturing method comprising the steps of:
    exposing a wafer to a pattern of a reflection mask using an exposure apparatus according to claim 13; and
    developing the exposed wafer.

* * * * *

UNITED STATES PATENT AND TRADEMARK OFFICE
CERTIFICATE OF CORRECTION

PATENT NO. : 6,642,528 B2
DATED : November 24, 2003
INVENTOR(S) : Mitsuaki Amemiya et al.

It is certified that error appears in the above-identified patent and that said Letters Patent is hereby corrected as shown below:

Title page,
Item [57], ABSTRACT,
Line 1, "method" should read -- a method --; and
Line 2, "include" should read -- includes --.

Column 6,
Line 25, "are" should read -- is --.

Column 8,
Line 31, "increases" should read -- increases, --.

Column 9,
Line 40, "voltage" should read -- Voltage --.

Column 11,
Line 12, the first occurrence of "the" should read -- a --.
Line 18, "the conditions" should read -- a condition --.
Line 19, "are" should read -- is --.
Line 21, "apparatus" should read -- apparatus of --.
Line 22, "conditions" should read -- condition --.
Line 29, "tions" should read -- tion -- and "include" should read -- is --.
Line 31, "are" should read -- is --.
Line 32, "ultraviolet" should read -- vacuum ultraviolet --.
Line 44, "the conditions" should read -- a condition --.
Line 45, "are" should read -- is --.

Column 12,
Line 4, "conditions" should read -- condition --.
Line 5, "include" should read -- is --.
Line 7, "are" should read -- is --.
Line 12, "A" should read --a --.

UNITED STATES PATENT AND TRADEMARK OFFICE
CERTIFICATE OF CORRECTION

PATENT NO.    : 6,642,528 B2
DATED         : November 24, 2003
INVENTOR(S)   : Mitsuaki Amemiya et al.

It is certified that error appears in the above-identified patent and that said Letters Patent is hereby corrected as shown below:

<u>Column 12, cont'd,</u>
Line 17, "the conditions" should read -- a condition --.
Line 18, "are" should read -- is --.
Line 38, "the conditions" should read -- a condition --.
Line 39, "are" should read -- is --.

Signed and Sealed this

Twenty-seventh Day of April, 2004

JON W. DUDAS
*Acting Director of the United States Patent and Trademark Office*